(12) United States Patent
Fahrner et al.

(10) Patent No.: US 7,701,200 B1
(45) Date of Patent: Apr. 20, 2010

(54) ACTIVE TEST SOCKET

(75) Inventors: Steven Fahrner, Chandler, AZ (US); Daniel Marcus, Tempe, AZ (US); James L. Jaquette, Mesa, AZ (US)

(73) Assignee: Interconnect Devices Inc., Kansas City, KS (US)

( * ) Notice: Subject to any disclaimer, the term of this patent is extended or adjusted under 35 U.S.C. 154(b) by 434 days.

(21) Appl. No.: 11/671,963

(22) Filed: Feb. 6, 2007

Related U.S. Application Data

(60) Provisional application No. 60/765,555, filed on Feb. 6, 2006.

(51) Int. Cl.
*G01R 31/28* (2006.01)

(52) U.S. Cl. .................................... 324/158.1

(58) Field of Classification Search ................. 324/755, 324/758, 765, 760, 158.1; 439/66.68, 482, 439/169, 174, 912, 259, 73, 331; 257/48; 438/14–18
See application file for complete search history.

(56) References Cited

U.S. PATENT DOCUMENTS

| | | | |
|---|---|---|---|
| 3,603,778 A * | 9/1971 | Walsh | 362/249.07 |
| 6,739,894 B2 * | 5/2004 | Ogura | 439/330 |
| 6,752,645 B2 * | 6/2004 | Nakamura et al. | 439/330 |

\* cited by examiner

*Primary Examiner*—Ha Tran T Nguyen
*Assistant Examiner*—Tung X Nguyen
(74) *Attorney, Agent, or Firm*—Pepper Hamilton LLP

(57) ABSTRACT

A test socket comprises a test socket body with a central opening configured to receive a device under test (DUT) including at least one arm opening in the test socket body; and at least one rotating arm disposed in the arm opening.

14 Claims, 8 Drawing Sheets

ACTIVE TEST SOCKET

RELATED APPLICATION DATA

The application claims benefit of U.S. Provisional Application Ser. No. 60/765,555, filed 6 Feb. 2006.

FIELD OF INVENTION

The invention relates to test sockets for electrical testing of semiconductor packages. Specifically, the invention relates to an improved test socket that includes rotating arms that engage a device under test to provide precision alignment.

BACKGROUND OF THE INVENTION

Electrical testing of semiconductor die has become an integral part of the semiconductor manufacturing process. Semiconductor die may be tested during various stages of manufacturing, for instance prior to plastic assembly, and just prior to shipment to customers. One goal of this testing is to identify defective parts before they are shipped to customers. However, falsely identifying good parts as defective parts can be very costly for the semiconductor manufacturer. Consequently, the reliability and accuracy of the equipment associated with the testing process is very important.

For electrical testing, the semiconductor packages are typically loaded into a test socket by a handler. The test socket and handler align the package so that electrical contacts on the package can be connected to a test board using electrical conductors such as pogo pins. The pogo pins are maintained in fixed positions in the plane of the test socket, but are capable of compressing perpendicular to the plane of the test socket to allow good contact with the electrical contacts of the semiconductor package. However, since the pogo pins can't move horizontally, the alignment of the semiconductor package with the pogo pins is critical. Conventional test sockets have a central cutout into which the semiconductor package fits. This cutout aligns the package along its edges, but can allow for some misalignment when the package dimensions are slightly smaller than expected. This misalignment can lead to bad contact (open connections) between the pogo pins and the electrical contacts on the package. A test socket that aligns the package using the corners of the package would therefore provide for more precise alignment and prevent open connections due to package misalignment.

In recent years, advancements in circuit design and semiconductor manufacturing have drastically reduced the size of semiconductor packages. As an example, chip-scale packages are commonly manufactured where the size of the overall package is approximately the same size as the semiconductor die. The decreasing size of the semiconductor packages means that the electrical contacts of the smaller packages are spaced closer together and in some cases are smaller. This presents challenges for the testing process because the testing equipment must be able to reliably contact all of the electrical contacts of the semiconductor package.

The semiconductor packages are typically manufactured in groups (either in wafer form or on substrate strips) and then singulated. As the packages become smaller, slight variations in the singulation process can lead to significant differences in final package dimensions. These slight variations in the singulation process may be caused by the type of singulation blade used, the amount of wear the blade has, and alignment tolerances of the singulation equipment. The variation in package dimensions can lead to misalignment in the test socket, as described above.

When combined together, the small package size, the tightly-packed electrical contacts, and the package dimension variation can lead to significant problems in the testing process. These problems can lead to good packages being falsely identified as failing the electrical tests, which can cause significant losses to the semiconductor manufacturer. Consequently, a test socket that is capable of precisely aligning small semiconductor packages, despite variations in package dimensions, is desired.

The invention addresses these and other disadvantages of the conventional art.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. In the description, relative terms such as "horizontal," "vertical," "up," "down," "top," and "bottom" as well as derivatives thereof (for example, "horizontally," "downwardly," "upwardly," etc.) should be construed to refer to the orientation as then described or as shown in the drawing figure under discussion unless otherwise specifically described. These relative terms are for convenience of description and normally are not intended to require a particular orientation. Terms "inwardly," "outwardly," "longitudinal" versus "lateral," "distal" versus "proximal," and the like are to be interpreted relative to one another or relative to an axis of elongation, or an axis or center of rotation, as appropriate. Terms such as "connected" and "interconnected" refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. Included in the drawing are the following figures.

DETAILED DESCRIPTION OF THE DRAWINGS

As used herein, the term "semiconductor package" refers to an assembly including at least one semiconductor device (e.g., a chip, a die, etc.) supported on a substrate (e.g., a circuit board).

Test sockets are used to secure semiconductor devices or like devices under test (DUT), for their testing. As the size of such DUTs have decreased, for example with QFN (Quad Flat No-Lead) packaging, the difficulty of properly aligning them within test sockets is increasing. Many conventional handlers which grasp and align DUTs within test sockets do so by the DUT's edges. However, the absolute accuracy by which the edges of such semiconductor devices (DUTs) are trimmed has essentially remained static even while the size of the semiconductor devices has decreased, thus resulting in a greater imprecision of their trimmed edges in relation to the smaller body size of the semiconductor devices. This has led to imprecise and improper alignment of the DUTs within test sockets. Such alignment tolerances are becoming in the realm of about 1/1000's of an inch so even 1/1000 of an inch may be critical in achieving proper alignment, and thus proper and accurate testing, of the DUT in question.

The present invention provides, for example, test socket indexing features located on rotating arms whose motion causes the indexing features to move toward the center of the test socket. The pivot structure of the rotating arms may be either a flexure integral to the test socket or an added/separate axle and spring, for example. The axis of each arm's rotation is in the horizontal plane about 45° to the socket edges which allows rotation of the index features out of the horizontal plane to accomplish centering on both horizontal axes simultaneously.

Figure 1:
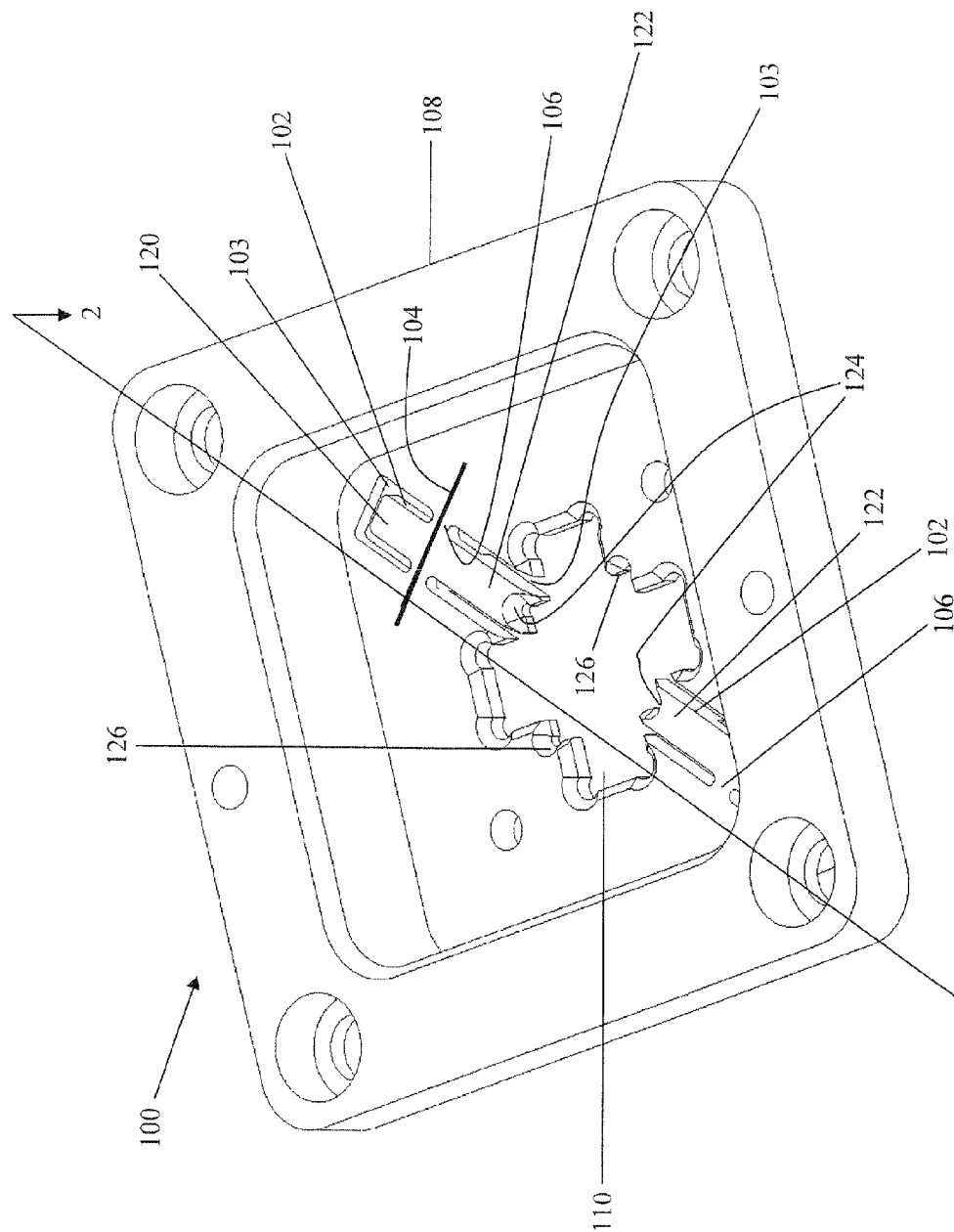
FIG. 1 is a test socket according to an exemplary embodiment of the present invention.

As shown in FIG. 1, in an exemplary embodiment of the present invention, active test socket 100 is analogous to existing test sockets having central opening 110 adapted to receive/seat a DUT but modified to include at least one pair of opposing rotating arms 102 within respective arm openings 103 of test socket body 108. Rotating arms 102 are operably connected to body 108 by bridging structures 106 which are adapted to rotate about respective axes 104. Bridging structures 106 define distal portion 120 and proximal portion 122 of each rotating arm 102. Each proximal portion 122 terminates in sculpted portion 124 (for example, arced portion 124 as shown in FIG. 1) proximate central opening 110. Sculpted portions 124 are adapted to contact/engage portions of a DUT seated/to be seated within central opening 110 so as to align the DUT therein as described in more detail below. When a single pair of opposing rotating arms 102 are used, test socket 100 includes a pair or opposing static corners 126 as shown in FIG. 1, for example.

Figure 8:
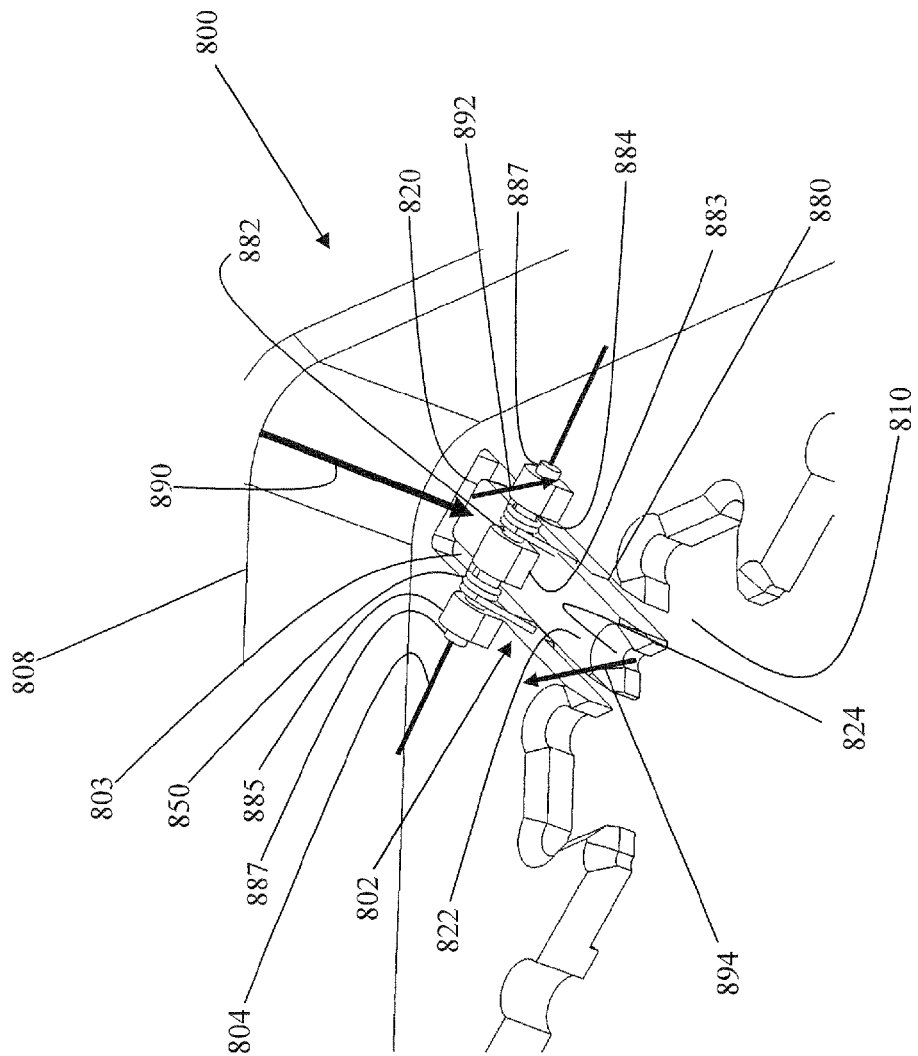
FIG. 8 is a perspective view of a test socket axle-rod rotating arm in a non-deflected position according to an exemplary embodiment of the present invention.

Active test socket 100 of the present invention may be comprised of a non-metal such as, for example, Torlon® (a synthetic resin containing polymers and copolymers of poly amide-imide and their derivatives and a registered trademark of Solvay Advanced Polymers L.L.C. Limited Partnership of 4500 McGinnis Ferry Road, Alpharetta Ga. 30000-5391), polyether, polyimide, or other plastics selected for their electrostatic properties. Active test socket 100 may be formed/molded as a unitary structure or it may be a main structure with a separate rotating arm structure 802 as shown in FIG. 8, for example, and as described below.

Figure 2:
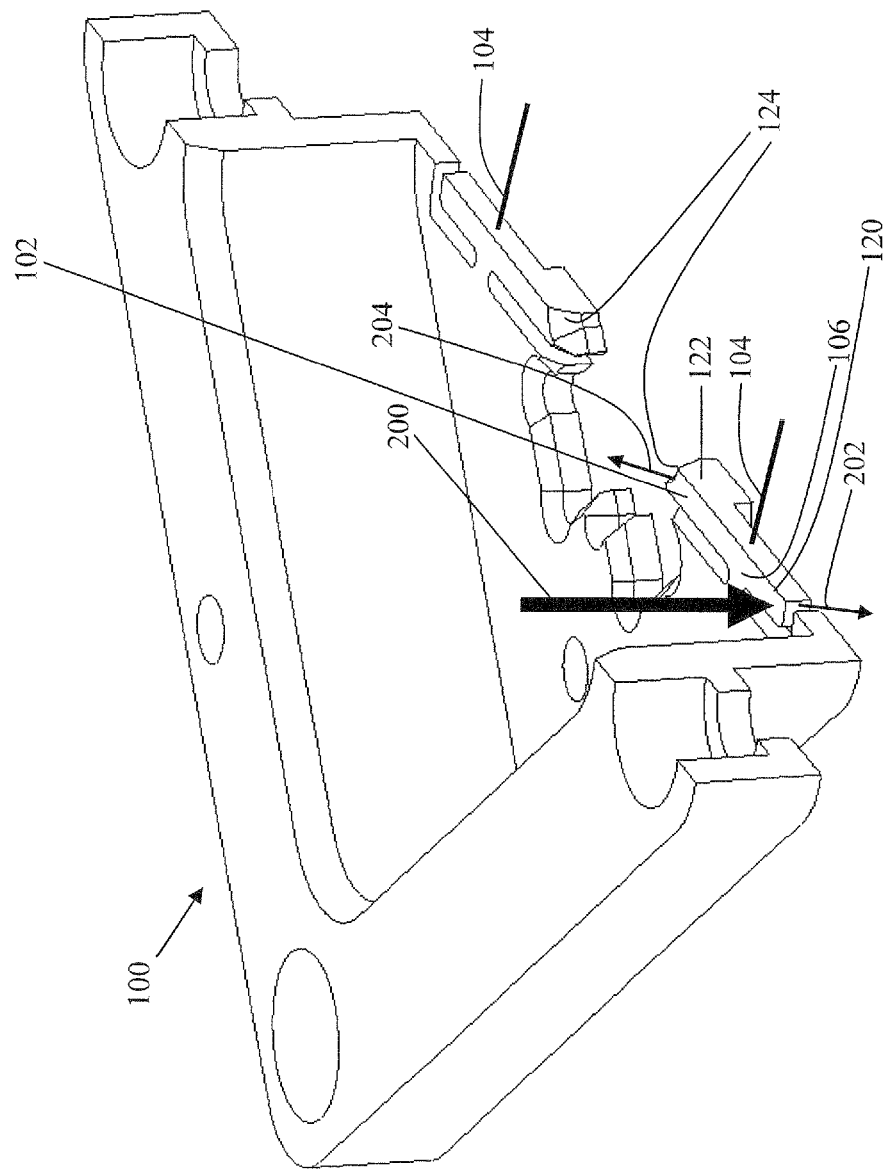
FIG. 2 is a cross-sectional view of FIG. 1 along line 2-2.

FIG. 2 is a cross-sectional view of FIG. 1 along line 2-2 and may more clearly show axes 104 about which rotating arms 102 are adapted to rotate. When, for example, a downward force 200 is exerted upon each distal arm portion 120, rotating arm 102 rotates about axis 104 and: (1) the outer edge of distal arm portion 120 is pushed downwardly, and slightly outwardly, as at 202, for example; and (2) the inner edge (sculpted portion 124) of proximal arm portion 122 rotates upwardly, and slightly inwardly, as at 204, for example.

Figure 3:
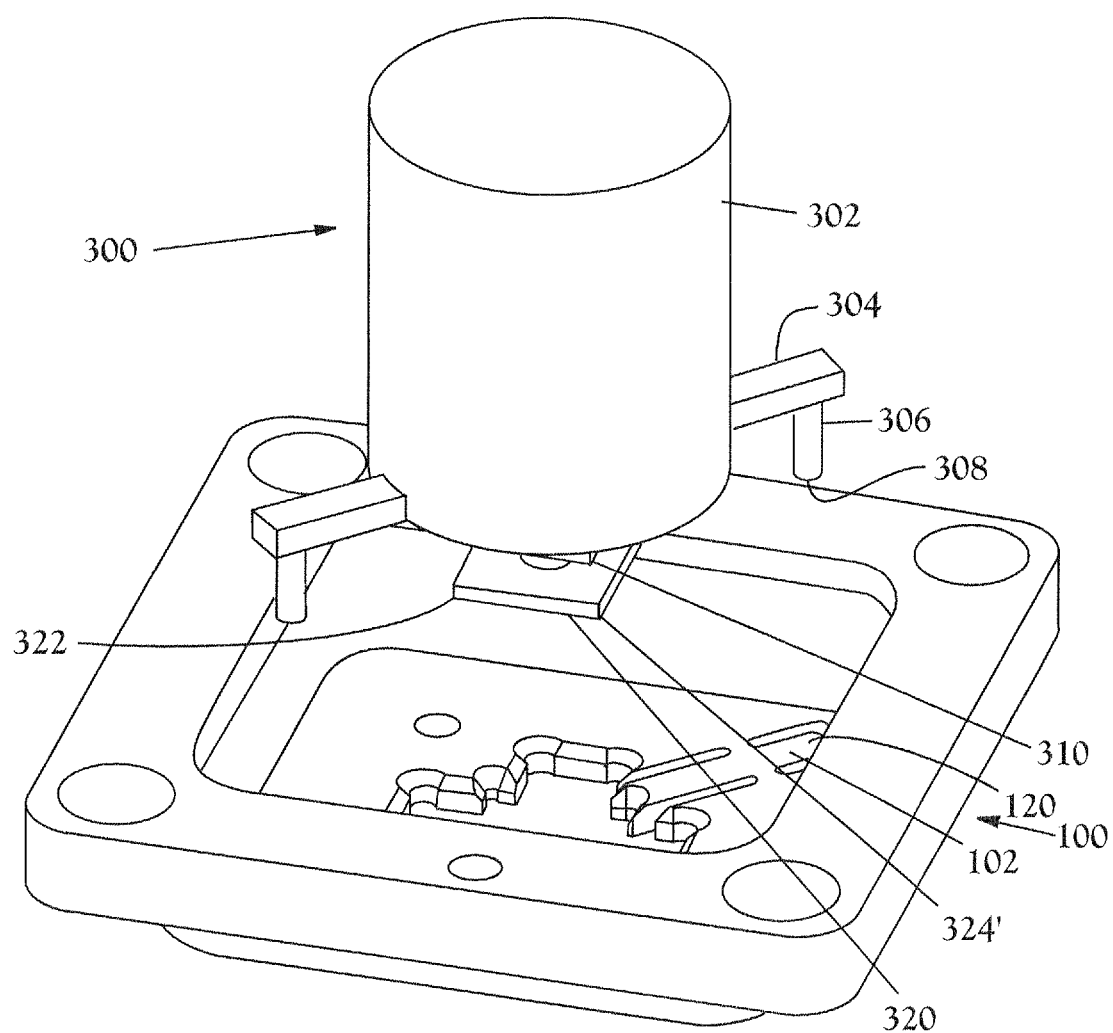
FIG. 3 is a handler with DUT approaching a test socket according to an exemplary embodiment of the present invention.

As shown in FIG. 3, in an exemplary embodiment of the present invention, handler 300 with engaged DUT 320 is shown aligned with, and approaching, active test socket 100. Handler 300 includes main body 302 and opposing engaging beams 304 proximate the bottom of main body 302. Engaging beams 304 include vertical portions 306 with lower ends 308 adapted to contact respective distal portions 120 of rotating arms 102. A generally central portion of DUT 320 is engaged by engaging portion 310 on the lower portion of main body 302, for example. DUT 320 includes pairs of opposing corners 322, 322' (not shown but see FIG. 5, for example); 324 (not shown but see FIG. 5, for example), 324'. DUT 320 may be a semiconductor package such as, for example, a QFN, BGA, or LGA type package. QFN 320, for example, may have dimensions from about 10 cm square to less than about 1 cm square.

The exemplary embodiments of the present invention are admirably suited for any circumstances with such smaller dimension DUTs 320 configured for a positional tolerance that can not be met with conventional test sockets, for example, as the width of any cutting saw/cutting apparatus or process singulating DUTs 320 becomes larger relative to the smaller and smaller DUTs 320. As noted above, this makes proper alignment of DUTs 320 directly with handler 300 problematic vis a vis aligned seating of DUTs 320 within conventional test sockets.

Figure 4:
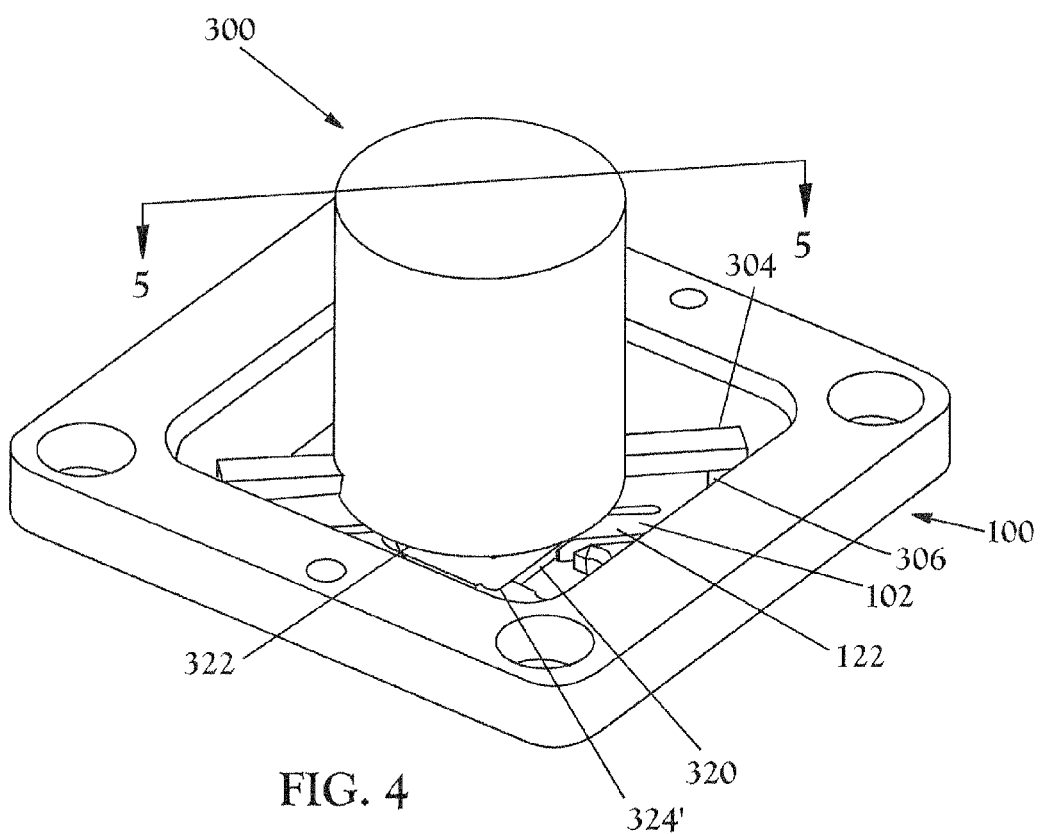
FIG. 4 is a perspective view of a handler with DUT making first contact with a test socket according to an exemplary embodiment of the present invention.

FIG. 4, in an exemplary embodiment of the present invention, is a perspective view of handler 300 with engaged DUT 320 shown in FIG. 3, for example, making first contact with active test socket 100 and before rotation of rotating arms 102 to engage DUT 320.

Figure 5:
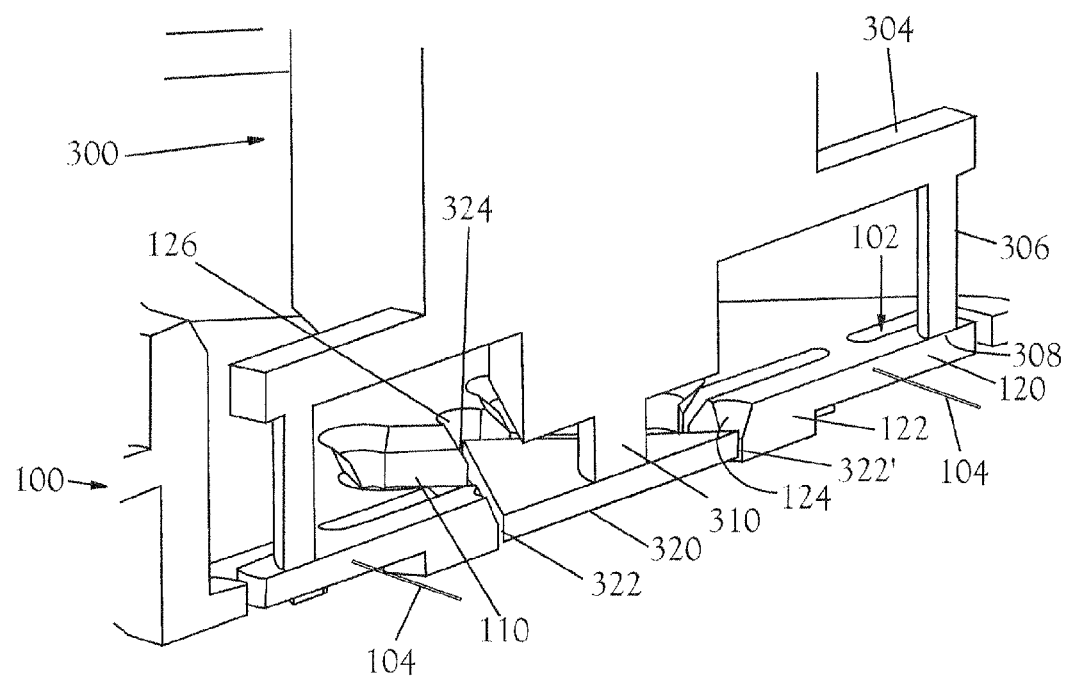
FIG. 5 is a cross-sectional view of FIG. 4 along line 5-5.

As shown in FIG. 5, a cross section of a portion of FIG. 4 about line 5-5, respective lower ends 308 of engaging beams 304 contact distal portions 120 of rotating arms 102. Handler 300 positions DUT 320 within central opening 110 of active test socket 100 with DUT opposing corners 322, 322' positioned proximate respective sculpted portions 124 of rotating arms 102 and DUT opposing corners 324, 324' (not shown) portioned proximate static corners 126 (when a single pair of rotating arms 102 are used as shown in FIG. 5, for example, otherwise corners 324, 324' would be positioned proximate their respective rotating arm sculpted portions).

Figure 6:
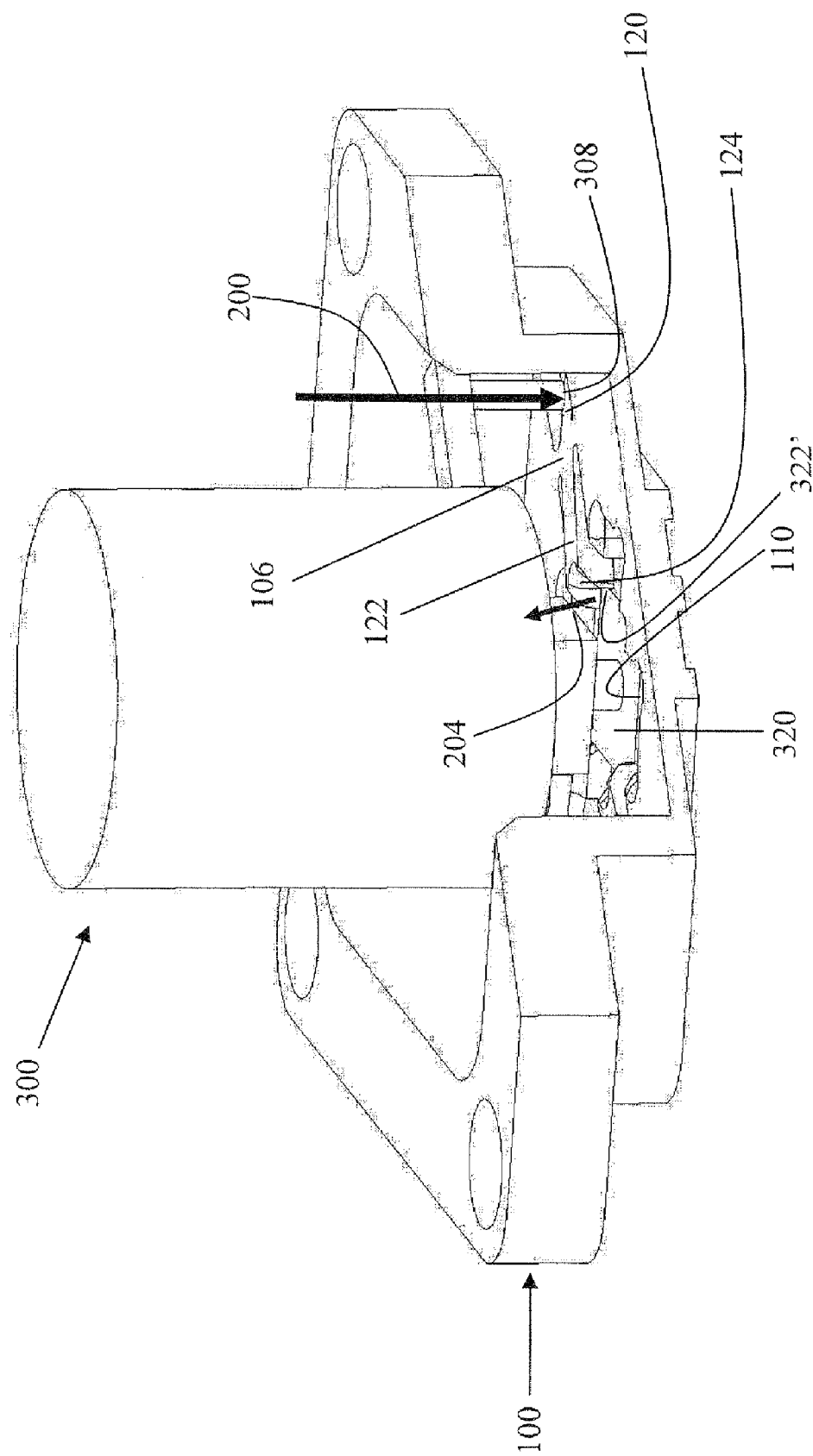
FIG. 6 is a perspective partial cross-sectional view of a handler with DUT engaging a test socket according to an exemplary embodiment of the present invention.

As shown in FIG. 6, in an exemplary embodiment of the present invention, as handler 300 continues its downward movement, its respective engaging beam lower ends 308 simultaneously press down upon each rotating arm distal portion 120 as at 200 causing rotating arm 102 to rotate about bridging (flexural or spring) portion 106/axis 104 (not shown but see FIG. 5, for example). This simultaneously raises each rotating arm proximal portion 122 upwardly, and inwardly, as at 204, engaging each DUT corner 322', 322 (not shown, but see FIG. 5, for example) by sculpted portion 124 and centering DUT 320 within active test socket central opening 110. For example, for about a 10 mil vertical movement of proximal arm portion 122/sculpted portion 124 caused by downward force 200, about a 2 mil sweep, or corresponding inward horizontal movement, may be achieved. Thus, a central opening 110 shrinkage of about 4 mils (may be varied by altering arm length and/or vertical movement) from corner to opposing corner may be achieved. It is noted that the engagement of DUT 320 to handler 300 is adapted to permit any necessary movement/centering/alignment of DUT 320 within opening 110 upon contact/engagement of DUT 320 with rotating arms 102.

Figure 7:
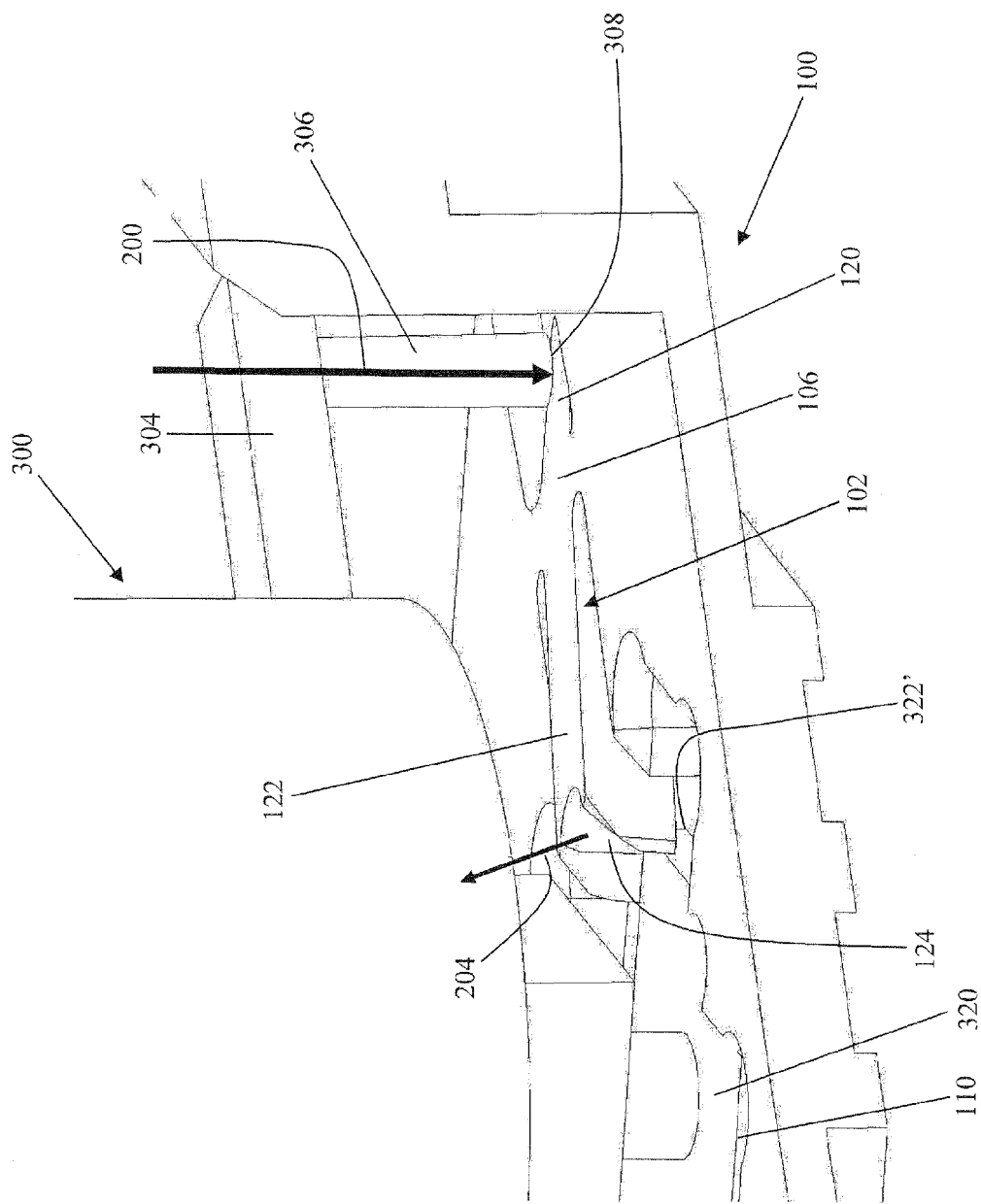
FIG. 7 is an enlarged view of a portion of FIG. 6.

FIG. 7 is an enlarged portion of FIG. 6, more clearly showing the engagement of corner 322' with rotating arm sculpted portion 124 when handler 300 engages distal portion 120 of rotating arms 102.

The maximum vertical motion of handler 300 after it contacts rotating arms 102 is generally limited by the deflection of rotating arms 102 against DUT 302. The force necessary to achieve a proper seating of DUT 302 within active test socket 100 may be comparable to the force encountered in conventional test socket configurations. Handler 300 engages DUT 320 throughout the DUT testing. Once testing is completed, handler 300 withdraws DUT 320 from active test socket 100.

As shown in FIG. 8, in another exemplary embodiment of the present invention, there is shown one of at least a pair of opposing axle rod rotating arms 802 comprising rotating arm body 880 within arm opening 803 and which, as further described, may substitute for rotating arms 102 as shown and described above. Unless otherwise shown or described, the exemplary embodiment shown in FIG. 8 is analogous to the exemplary embodiment shown in the previous Figs. Each axle rod rotating arm 802 includes an axle rod support structure 883 through which axle 882, or the like, is retained. Body 808 of active test socket 800 includes a pair of opposing axle rod body support structures 885 within which opposing ends of axle 882 are retained, thus operably connecting rotating arm 802 to active socket body 808. Axle 882 is adapted to rotate about axis 804. Axle caps 887 are affixed to opposing ends of axle 882 to retain axle 882 within support structures 883, 885 and which may permit free rotation of axle 882 within one or more support structures 883, 885.

Springs 850, or the like, bias axle rod rotating arm 802 in the non-deflected (non-loaded) position as shown in FIG. 8. Springs 850 may be torsion springs as shown with one end of each spring 850 connected to/contacting rotating arm 802, with the main body of each spring 882 wrapped around a portion of axle 882 (e.g., the other end of spring 882 may be attached to the main socket body at, for example, fixed lock washers 884).

Opposing ends of springs 882 are connected to fixed (lock) washers 884, or the like, on axle 882 to permit the spring force necessary to bias rotating arm in the non-deflected position (when a handler (not shown) is not engaging distal end portion 820.

Axle rod rotating arm support structure 883 defines distal portion 820 and proximal portion 822 of axle rod arm body 880. Proximal portion 882 terminates in sculpted portion 824 (for example, arced portion 824 as shown in FIG. 8) proximate central opening 810. When a downward force 890, for example, is exerted upon distal arm portion 820, rotating arm 802 rotates about axis 804 and: (1) the outer edge of distal arm portion 820 is pushed downwardly, and slightly outwardly, as at 892, for example; and (2) the inner edge (sculpted portion 824) of proximal arm portion 822 rotates upwardly, and slightly inwardly, as at 894, for example. This permits contact/engagement of opposing axle rod rotating arms 802 with respective corners of a DUT (not shown) at the sculpted portion 824 to precisely seat/align the DUT within opening 810 (see analogous FIGS. 3 to 7 and related description above, for example).

It is contemplated that other springs/types of springs with related structures than that shown in FIG. 8 may be employed to bias rotating arm 802 in a non-loaded position.

It is noted that as opposing rotating arm sculpted portions 124, 824 simultaneously engage opposing DUT corners 322, 322' in an inwardly and upwardly manner, any imprecision about the DUT trimmed edge periphery caused by the cutting process to singulate DUT 320 as noted above is substantially reduced (e.g., averaged between the two edges) or may even be completely overcome, permitting accurate centering of DUT 320 within active test socket central opening 110, 810.

The present invention may reduce the effects of the device size tolerances on the positional accuracy of the device pads relative to the socket probes. The active test socket of the present invention permits accommodation of smaller and smaller DUTs by indexing off of opposing corners. This opposing corner indexing thus effectively indexes to the centerline datums of DUTs 320 rather than the edge(s) of DUTs 320 and may substantially reduce and/or obviate any imprecision encountered about the DUT periphery after singulation of DUTs 320.

While DUT 320 has been illustrated as having a square shape with opposing corners 320, 320'; 322, 322', it is contemplated that the teachings of the present invention may be adapted to DUTs having differing shapes and configurations. Further, while a single pair of opposing rotating arms 102, 802 have been illustrated, two, or more, pairs of opposing rotation arms 102, 802 may be employed depending upon the shape/configuration of the DUTs to be engaged/tested. For example, for a square-shaped DUT 320 as shown in FIGS. 3 to 7, for example, another pair of opposing rotating arms 102, 802 may be employed effectively replacing static corners 126. It is contemplated that one or more pair of rotating arms 102 may be used with one or more pair of axle-rod rotating arms 802, and visa versa. It is also contemplated that for a DUT having an odd number of corners, and odd number of rotating arms 102, 802 may be employed, for example for a pentagon-shaped DUT three (3) (roughly opposing) or five (5) rotating arms 102, 802 may be used to ensure proper alignment of the pentagon-shaped DUT with opening 110, 810.

Active test socket 100, 800 may work with any interposer in the testing of DUTs 320, for example, pogo pins, spring pins, compressible members such as those described in U.S. patent application Ser. No. 10/736,280, which is incorporated by reference in its entirety, a layered interconnect structure (for example formed by photolithographic techniques), a flexible sheet of contacts such as that described in U.S. Patent Application Publication 2005/0159025A1, etc.

The present invention may be embodied in other specific forms without departing from the spirit or essential attributes thereof. Although the invention has been described and illustrated with respect to the exemplary embodiments thereof, it should be understood by those skilled in the art that the foregoing and various other changes, omissions and additions may be made therein and thereto, without parting from the spirit and scope of the present invention.

The invention claimed is:

1. A test socket, comprising:
    a test socket body;
    a central opening in the test socket body, the central opening configured to receive a device under test (DUT);
    at least one arm opening in the test socket body;
    at least one rotating arm disposed in the arm opening; and
    at least one bridge in the test socket body, the bridge separating a distal portion of the rotating arm from a proximal portion of the rotating arm.

2. The test socket of claim 1, wherein the proximal portion of the rotating arm comprises a sculpted portion configured to contact a corner of the DUT.

3. The test socket of claim 1, wherein the rotating arm is configured to rotate about an axis when pressure is applied to the distal portion, thereby raising the proximal portion above a plane of the central opening.

4. The test socket of claim 1, wherein the test socket comprises two rotating arms disposed at opposing corners of the central opening.

5. The test socket of claim 4 further comprising two static corners disposed at corners of the central opening that do not include the rotating arms.

6. The test socket of claim 1, wherein the test socket comprises four rotating arms disposed at four corners of the central opening.

7. The test socket of claim 1, wherein the test socket comprises a plastic material.

8. The test socket of claim 1, wherein the rotating arm comprises:
   a rotating arm body;
   a first axle support structure on the rotating arm body;
   at least one second axle support structure on the test socket body; and
   an axle disposed in the first and second axle support structures.

9. The test socket of claim 8, wherein the rotating arm further comprises at least one axle cap affixed to at least one end of the axle.

10. The test socket of claim 8, wherein the rotating arm further comprises at least one spring.

11. The test socket of claim 10, wherein a first end of the spring is attached to the rotating arm body and a second end of the spring is attached to the test socket body.

12. The test socket of claim 11, wherein the second end of the spring is attached to the test socket body at a fixed lock washer.

13. The test socket of claim 8, wherein the rotating arm body comprises a sculpted end, the sculpted end configured to contact the DUT.

14. A test socket, comprising:
   a test socket body;
   a central opening in the test socket body, the central opening configured to receive a device under test (DUT);
   two arm openings disposed at opposing corners of the central opening in the test socket body;
   two rotating arms disposed in the arm openings, each rotating arm comprising a sculpted portion at an end thereof; and
   two bridges, each bridge connecting a respective one of the rotating arms to the test socket body and allowing the rotating arms to rotate about the bridges.

* * * * *